United States Patent
Kajiyama et al.

(10) Patent No.: US 10,985,232 B2
(45) Date of Patent: Apr. 20, 2021

(54) DISPLAY DEVICE INCLUDED A FOLDED-BACK DISPLAY PANEL PORTION FOR A DRIVER

(71) Applicant: Japan Display Inc., Minato-ku (JP)

(72) Inventors: Kenta Kajiyama, Minato-ku (JP); Masumi Nishimura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/512,646

(22) Filed: Jul. 16, 2019

(65) Prior Publication Data
US 2019/0341442 A1    Nov. 7, 2019

Related U.S. Application Data

(63) Continuation of application No. PCT/JP2017/041959, filed on Nov. 22, 2017.

(30) Foreign Application Priority Data

Jan. 20, 2017   (JP) .............................. JP2017-008563

(51) Int. Cl.
*H01L 27/32*     (2006.01)
*H01L 51/00*     (2006.01)

(52) U.S. Cl.
CPC ...... *H01L 27/3276* (2013.01); *H01L 27/3258* (2013.01); *H01L 51/0097* (2013.01); *H01L 2251/5338* (2013.01)

(58) Field of Classification Search
CPC .................................................. H01L 51/0097
See application file for complete search history.

(56) References Cited

U.S. PATENT DOCUMENTS

2014/0042406 A1   2/2014   Degner et al.
2014/0203703 A1   7/2014   Maatta
(Continued)

FOREIGN PATENT DOCUMENTS

CN    104934438 A    9/2015
JP    02-132418      5/1990
JP    2014-197181    10/2014

OTHER PUBLICATIONS

International Preliminary Report on Patentability and Written Opinion dated Jul. 23, 2019 in PCT/JP2017/041959 (with English translation).

(Continued)

*Primary Examiner* — Suberr L Chi
(74) *Attorney, Agent, or Firm* — Oblon, McClelland, Maier & Neustadt, L.L.P.

(57) ABSTRACT

A display device according to an embodiment of the present invention includes: an insulating sheet provided from a display region to a drive portion forming region, including, in a curved region, a first film-thickness region having a first film thickness thinner than a film thickness at the display region and a film thickness at the drive portion forming region, and including a first step portion disposed between the display region and the first film-thickness region and a second step portion disposed between the drive portion forming region and the first film-thickness region, first and second wiring lines crossing the first step portion and the second step portion above the insulating sheet and electrically connecting a pixel array portion with a drive portion, and an insulating wall extending from the first step portion to the second step portion between the first wiring line and the second wiring line.

17 Claims, 20 Drawing Sheets

(56) References Cited

U.S. PATENT DOCUMENTS

| | | | |
|---|---|---|---|
| 2014/0232956 A1 | 8/2014 | Kwon et al. | |
| 2014/0240985 A1 | 8/2014 | Kim et al. | |
| 2014/0254111 A1 | 9/2014 | Yamazaki et al. | |
| 2014/0355227 A1 | 12/2014 | Lim | |
| 2016/0172428 A1 | 6/2016 | Song et al. | |
| 2019/0363142 A1* | 11/2019 | Tanaka | H01L 51/003 |

OTHER PUBLICATIONS

International Search Report dated Feb. 20, 2018 in PCT/JP2017/041959, filed on Nov. 22, 2017.

Combined Chinese Office Action and Search Report dated Oct. 29, 2020 in Patent Application No. 201780084096.6 (with English language translation), 20 pages.

* cited by examiner

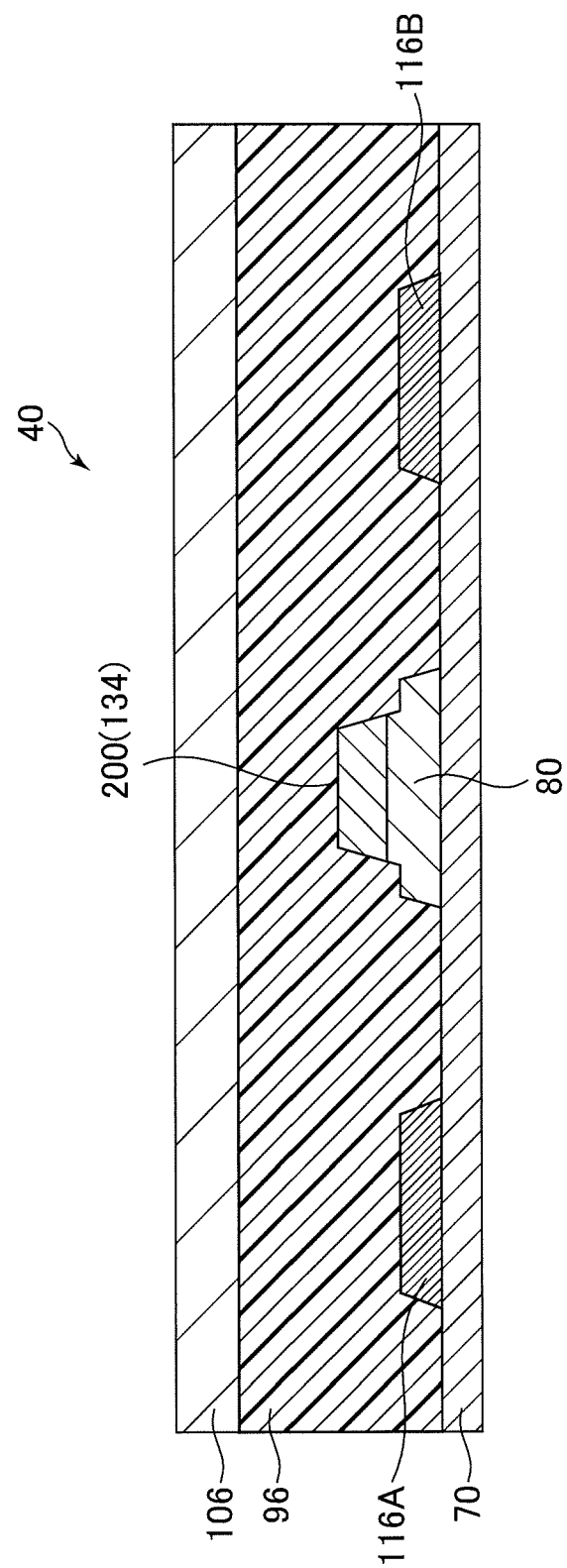

DISPLAY DEVICE INCLUDED A FOLDED-BACK DISPLAY PANEL PORTION FOR A DRIVER

CROSS-REFERENCE TO RELATED APPLICATIONS

This application is a continuation under 35 U.S.C. 120 of International Application PCT/JP2017/041959 having the International Filing Date of Nov. 22, 2017, and having the benefit of the earlier filing date of Japanese Application No. 2017-008563, filed on Jan. 20, 2017. Each of the identified applications is fully incorporated herein by reference.

BACKGROUND OF THE INVENTION

1. Field of the Invention

One or more embodiments of the present invention relate to a display device.

2. Description of the Related Art

A flat panel display such as an organic electroluminescence (EL) display device includes a display panel in which thin film transistors (TFTs), organic light-emitting diodes (OLEDs), and the like are formed on a substrate. A glass substrate has been conventionally used for a base material of the display panel; however, development of a flexible display in which the display panel can be bent has recently progressed using a resin film such as a polyimide film or the like for the base material.

As applications of the flexible display, it is considered to achieve a narrower picture frame by folding a mount portion for an integrated circuit (IC) or a flexible printed circuit (FPC), which is provided outside an image display region of the display panel, onto the rear side of the display region.

U.S. Patent Application Publication No. 2016/0172428 discloses a configuration in which, in a curved region formed by folding the mount portion onto the rear surface side of the display region, a plurality of wiring lines at different potentials are provided on the upper surface of an insulating sheet.

SUMMARY OF THE INVENTION

However, in the conventional configuration, short prevention between the plurality of wiring lines at different potentials is not sufficient. That is, in the curved region, the rigidity of the insulating sheet needs to be reduced, and therefore, it is desirable to make the film thickness of the insulating sheet thin. However, when the film thickness of the insulating sheet is made thin in a stepwise manner, a step portion connecting the plurality of wiring lines may be generated. At this step portion, when a wiring layer is formed on the upper surface of the insulating sheet and then the wiring layer is processed into a wiring line shape by dry etching or the like, there is a possibility that an unnecessary wiring layer is not removed but remains. As a result, there is a risk that a short occurs because the remaining portion of the wiring layer electrically connects the plurality of wiring lines at different potentials.

One or more embodiments of the invention have been made in view of the problem, and it is an object thereof to achieve short prevention between a plurality of wiring lines at different potentials in a curved region.

(1) A display device according to the disclosure includes a display panel including a display region including a pixel array portion, a drive portion forming region provided on a rear surface side of the display region and including a drive portion driving the pixel array portion, and a curved region coupling the display region with the drive portion forming region, wherein the display panel includes an insulating sheet provided from the display region to the drive portion forming region, including, in the curved region, a first film-thickness region having a first film thickness thinner than a film thickness at the display region and a film thickness at the drive portion forming region, and including a first step portion disposed between the display region and the first film-thickness region and a second step portion disposed between the drive portion forming region and the first film-thickness region, first and second wiring lines crossing the first step portion and the second step portion above the insulating sheet and electrically connecting the pixel array portion with the drive portion, and an insulating wall extending from the first step portion to the second step portion between the first wiring line and the second wiring line.

(2) In the display device according to the above-mentioned (1), an upper surface of the insulating wall may be continuous with an upper surface of the insulating sheet in the display region and the drive portion forming region.

(3) The display device according to the above-mentioned (1) or (2) may include a first conductor disposed at the first step portion and the second step portion.

(4) In the display device according to any one of the above-mentioned (1) to (3), the insulating sheet may include, on a center side of the first film-thickness region, a second film-thickness region having a second film thickness thinner than the first film thickness, and at least one of the first wiring line and the second wiring line may be disposed so as to cross a third step portion disposed between the first film-thickness region and the second film-thickness region.

(5) The display device according to the above-mentioned (4) may include a second conductor disposed at the third step portion.

(6) In the display device according to the above-mentioned (4) or (5), the insulating sheet may include an insulating base material and a first insulating film provided on the insulating base material, and an upper surface of the insulating base material may be exposed from at least a portion of the first insulating film in the second film-thickness region.

(7) In the display device according to the above-mentioned (6), the insulating base material may be made of polyimide.

(8) In the display device according to the above-mentioned (6), the first insulating film may be formed of a stacked body of a silicon oxide layer and a silicon nitride layer.

(9) In the display device according to the above-mentioned (6), the insulating sheet may further include a second insulating film between the first insulating film in the display region and the first wiring line and between the first insulating film and the second wiring line.

(10) In the display device according to the above-mentioned (9), a step reducing layer may be provided between the second insulating film and the first insulating film.

(11) In the display device according to the above-mentioned (9) or (10), at least a portion of the insulating wall may be made of the same material as the second insulating film.

(12) In the display device according to any one of the above-mentioned (1) to (11), the first wiring line and the second wiring line may be signal lines at different potentials.

(13) A display device according to the disclosure includes a display panel including a display region including a pixel array portion, a drive portion forming region provided on a rear surface side of the display region and including a drive portion driving the pixel array portion, and a curved region coupling the display region with the drive portion forming region, wherein the display panel includes an insulating base material made of an organic material, an inorganic insulating film provided on the insulating base material, made of an inorganic insulating material, provided from the display region to the drive portion forming region, including, in the curved region, a first film-thickness region having a first film thickness thinner than a film thickness at the display region and a film thickness at the drive portion forming region, and including a first step portion disposed between the display region and the first film-thickness region and a second step portion disposed between the drive portion forming region and the first film-thickness region, first and second wiring lines crossing the first step portion and the second step portion above the inorganic insulating film and electrically connecting the pixel array portion with the drive portion, and an insulating wall extending from the first step portion to the second step portion between the first wiring line and the second wiring line.

(14) In the display device according to the above-mentioned (13), an upper surface of the insulating wall may be continuous with an upper surface of the inorganic insulating film in the display region and the drive portion forming region.

(15) The display device according to the above-mentioned (13) or (14) may include a first conductor disposed at the first step portion and the second step portion.

(16) In the display device according to any one of the above-mentioned (13) to (15), the inorganic insulating film may include, on a center side of the first film-thickness region, a second film-thickness region having a second film thickness thinner than the first film thickness, and at least one of the first wiring line and the second wiring line may be disposed so as to cross a third step portion disposed between the first film-thickness region and the second film-thickness region.

(17) In the display device according to the above-mentioned (13), the inorganic insulating film may include a first insulating film disposed between the insulating base material and the first and second wiring lines, and a second insulating film disposed between the first insulating film and the first and second wiring lines.

(18) In the display device according to the above-mentioned (17), a step reducing layer may be provided between the second insulating film and the first insulating film.

(19) In the display device according to the above-mentioned (17) or (18), at least a portion of the insulating wall may be made of the same material as the second insulating film.

BRIEF DESCRIPTION OF THE DRAWINGS

FIG. 20 is a schematic vertical sectional view of the display panel at a position along line XX-XX shown in FIG. 15.

DETAILED DESCRIPTION OF THE INVENTION

First Embodiment

Figure 1:
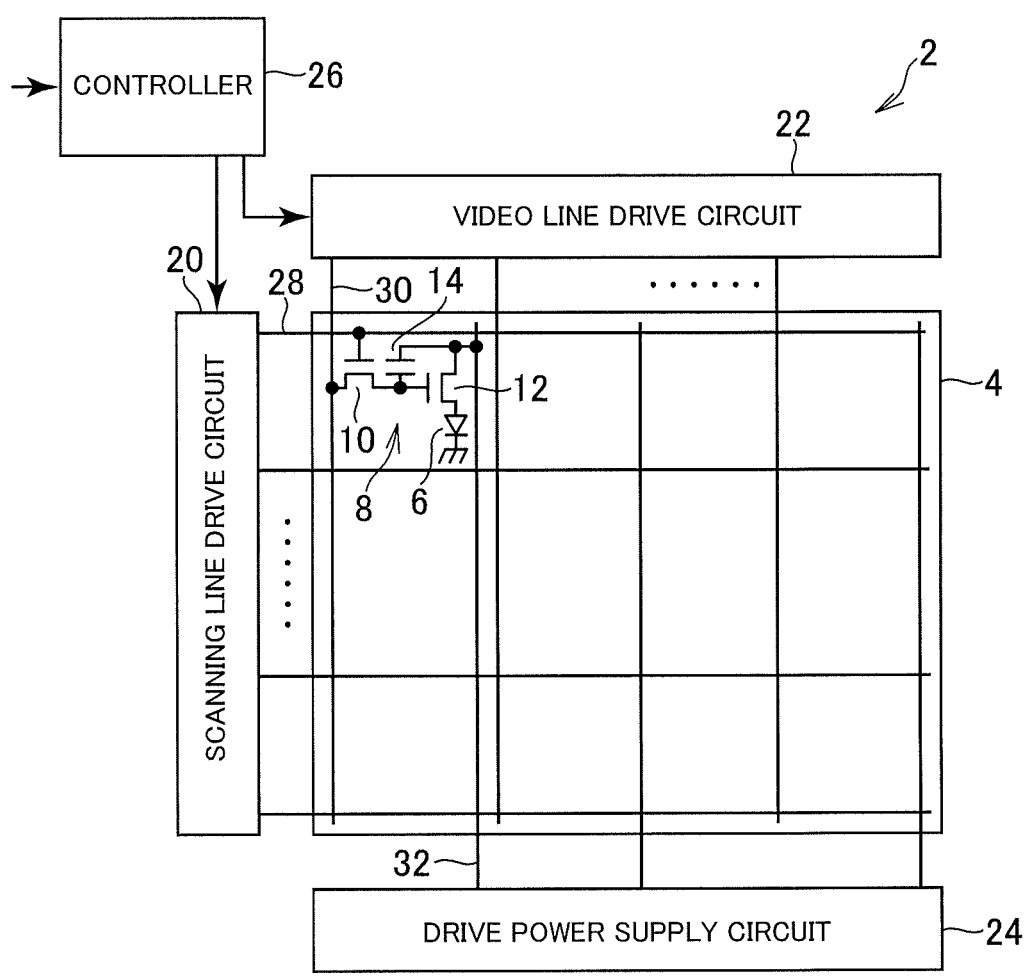
FIG. 1 is a schematic view showing a schematic configuration of a display device according to an embodiment.

Hereinafter, an embodiment of the invention will be described based on the drawings.

The disclosure is merely an example. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in an actual aspect. However, they are merely examples, and do not limit the interpretation of the invention. Moreover, in the specification and the drawings, elements similar to those described in relation to a previous drawing are denoted by the same reference numerals and signs, and a detailed description may be appropriately omitted. Further, unless otherwise noted, embodiments of the invention can be combined with each other.

A display device 2 according to the embodiment is, for example, an organic electroluminescence display device, and is mounted in a television set, a personal computer, a portable terminal, a mobile phone, and the like. FIG. 1 is a schematic view showing a schematic configuration of the display device 2 according to the embodiment. The display device 2 includes a pixel array portion 4 that displays an image, and a drive portion that drives the pixel array portion 4. The display device 2 is a flexible display, and includes a wiring layer including a base material formed of a resin film or the like having flexibility and wiring lines provided within or above the base material.

In the pixel array portion 4, organic light-emitting diodes 6 and pixel circuits 8 are disposed in a matrix corresponding to pixels. The pixel circuit 8 includes a lighting thin film transistor (TFT) 10, a drive TFT 12, and a capacitor 14.

On the other hand, the drive portion includes a scanning line drive circuit 20, a video line drive circuit 22, a drive power supply circuit 24, and a controller 26, drives the pixel circuit 8, and controls emission of the organic light-emitting diode 6.

The scanning line drive circuit 20 is connected to a scanning signal line 28 provided for each array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to a video signal line 30 provided for each array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies a current in response to the written voltage to the organic light-emitting diode 6, and thus the organic light-emitting diode 6 of the pixel corresponding to the selected scanning signal line 28 emits light.

The drive power supply circuit 24 is connected to a drive power supply line 32 provided for each pixel column, and supplies a current to the organic light-emitting diode 6 via the drive power supply line 32 and the drive TFT 12 in the selected pixel row.

Here, a lower electrode of the organic light-emitting diode 6 is connected to the drive TFT 12. On the other hand, upper electrodes of the organic light-emitting diodes 6 are composed of an electrode common to the organic light-emitting diodes 6 of all pixels. When the lower electrode is configured as an anode, a high potential is input thereto, the upper electrode serves as a cathode, and a low potential is input thereto. When the lower electrode is configured as a cathode, a low potential is input thereto, the upper electrode serves as an anode, and a high potential is input thereto.

Figure 2:
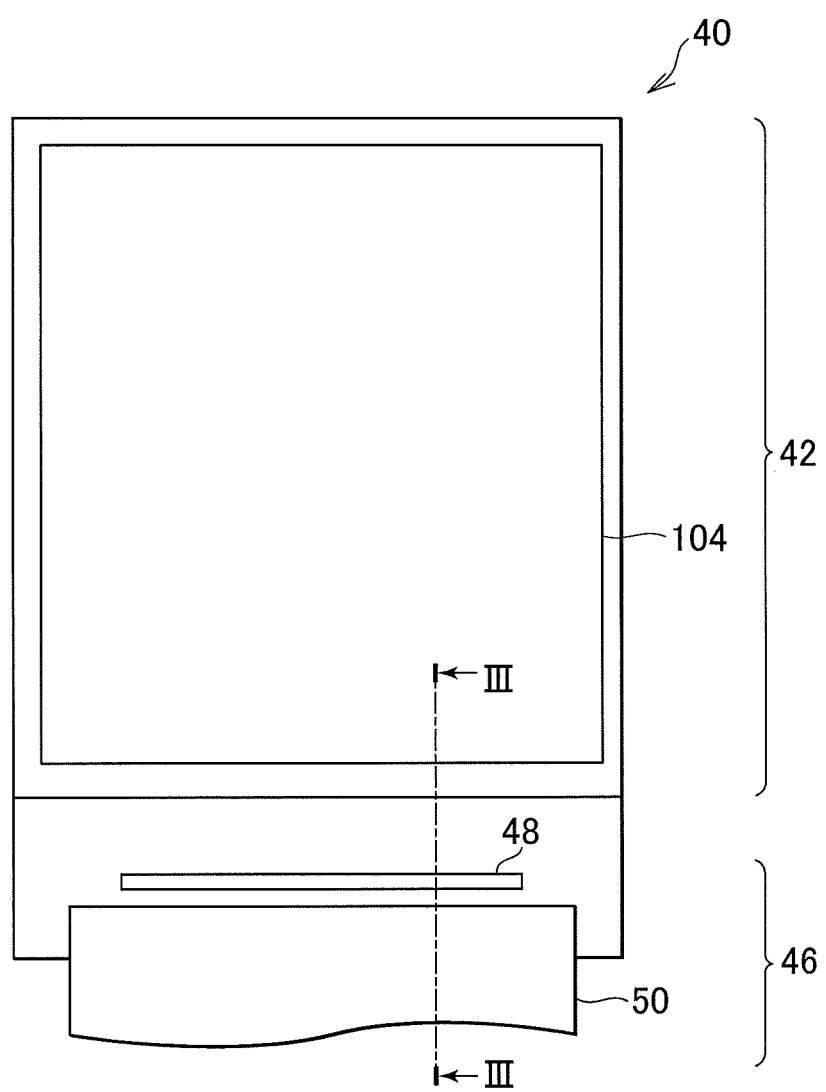
FIG. 2 is a schematic plan view of a display panel in the display device according to the embodiment.

FIG. 2 is a schematic plan view of a display panel 40 of the display device 2. The pixel array portion 4 shown in FIG. 1 is provided in a display region 42 of the display panel 40, and the organic light-emitting diodes 6 are arranged in the pixel array portion 4 as described above. An upper electrode 104 constituting the organic light-emitting diode 6 is formed common to pixels as described above, and covers substantially the entire display region 42.

A drive portion forming region 46 is provided at one side of the display panel 40 having a rectangular shape, and wiring lines connecting to the display region 42 are disposed. Further, a driver IC 48 constituting the drive portion is mounted in the drive portion forming region 46, or a flexible printed circuits (FPC) 50 is connected thereto. The FPC 50 is connected to the scanning line drive circuit 20, the video line drive circuit 22, the drive power supply circuit 24, the controller 26, and the like, or an IC is mounted on the FPC 50.

Figure 3:
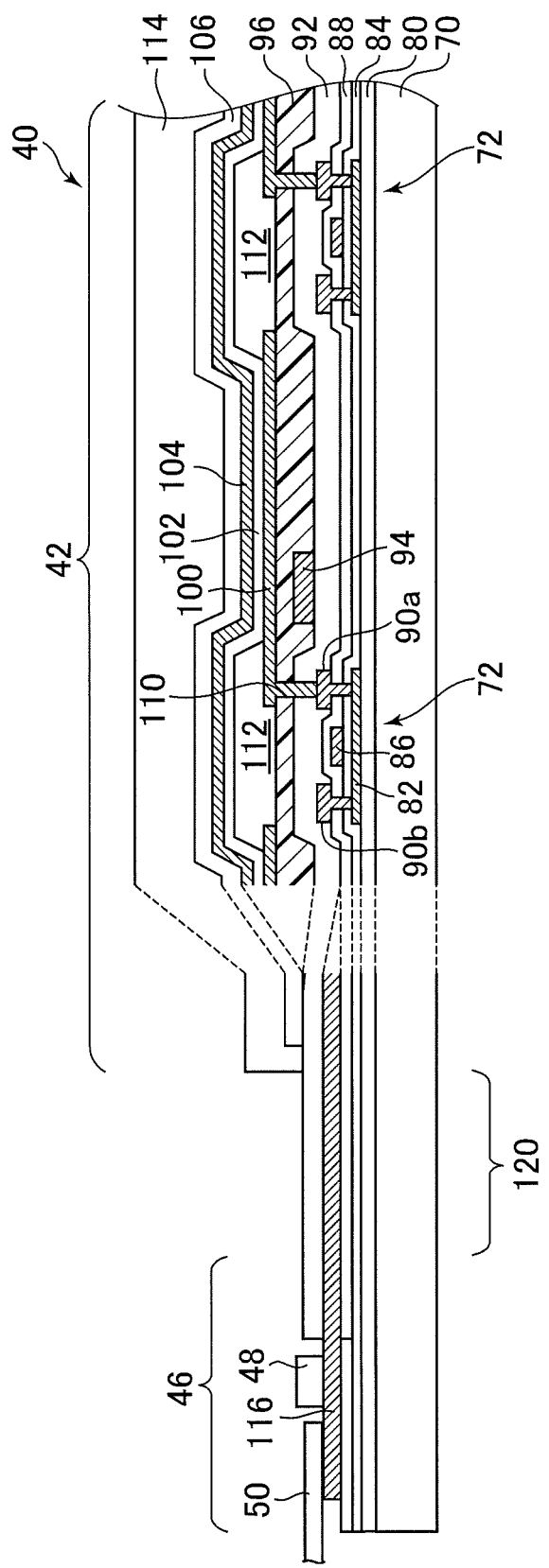
FIG. 3 is a schematic vertical sectional view of the display panel at a position along line III-III shown in FIG. 2.

FIG. 3 is a schematic vertical sectional view of the display panel 40 at a position along line III-III shown in FIG. 2. The display panel 40 has a structure in which a circuit layer formed of TFTs 72 and the like, the organic light-emitting diodes 6, a sealing layer 106 sealing the organic light-emitting diodes 6, and the like are stacked on an insulating base material 70 formed of a resin film. For example, a polyimide film can be used as the insulating base material 70. A protective film 114 can be formed on the sealing layer 106. In the embodiment, the pixel array portion 4 is of a top-emission type, and the light generated by the organic light-emitting diode 6 is emitted to the side opposite to the insulating base material 70, that is, upward in FIG. 3. When a color filter system is employed as a coloring system in the display device 2, a color filter is disposed between the sealing layer 106 and the protective film 114, or on a counter substrate side, white light is generated by the organic light-emitting diode 6, and the white light is caused to pass through the color filter to thereby produce light of colors such as, for example, red (R), green (G), and blue (B).

The pixel circuit 8, the scanning signal line 28, the video signal line 30, the drive power supply line 32, and the like, which are described above, are formed in the circuit layer of the display region 42. Moreover, at least a portion of the drive portion can be formed as the circuit layer on the insulating base material 70 in a region adjacent to the display region 42. As described above, the driver IC 48 which constitutes the drive portion and the FPC 50 can be connected to wiring lines 116 of the circuit layer in the drive portion forming region 46.

Specifically, a polysilicon (p-Si) film is formed on the insulating base material 70 via a first insulating film 80 as an under layer made of an inorganic insulating material such as silicon nitride (SiNy) or silicon oxide (SiOx), and the p-Si film is patterned to selectively leave the p-Si film at places to be used in the circuit layer. For example, a semiconductor region 82 serving as a channel portion and a source-drain portion of the TFT 72 of a top-gate type is formed using the p-Si film. A gate electrode 86 is disposed on the channel portion of the TFT 72 via a gate insulating film 84. The gate electrode 86 is formed by patterning a metal film formed by sputtering or the like. After this, an interlayer insulating film 88 covering the gate electrode 86 is stacked. An impurity is introduced by ion implantation into the p-Si serving as the source portion and the drain portion of the TFT 72, and further, a source electrode 90a and a drain electrode 90b that are electrically connected to the portions are formed. After the TFT 72 is formed in this manner, an interlayer insulating film 92 is stacked. On the surface of the interlayer insulating film 92, a wiring line 94 and the like can be formed by pattering a metal film formed by sputtering or the like. Using the metal film and the metal film used for the formation of the gate electrode 86, the source electrode 90a, and the drain electrode 90b, for example the wiring line 116, and the scanning signal line 28, the video signal line 30, and the drive power supply line 32, which are shown in FIG. 1, can be formed to have a multilayer wiring structure. On this, for example, a planarization film 96 is formed by stacking an organic material such as an acrylic resin, and the organic light-emitting diode 6 is formed on the surface of the display region 42 planarized by the planarization film 96.

The organic light-emitting diode 6 includes a lower electrode 100, an organic material layer 102, and the upper electrode 104. The lower electrode 100, the organic material layer 102, and the upper electrode 104 are stacked in order from the insulating base material 70 side. In the embodiment, the lower electrode 100 is an anode of the organic light-emitting diode 6, and the upper electrode 104 is a cathode. The organic material layer 102 is configured to include a hole transport layer, a light-emitting layer, an electron transport layer, and the like.

When it is assumed that the TFT 72 shown in FIG. 3 is the drive TFT 12 having an n-channel, the lower electrode 100 is connected to the source electrode 90a of the TFT 72. Specifically, after the formation of the planarization film 96 described above, a contact hole 110 for connecting the lower electrode 100 to the TFT 72 is formed, and by patterning a conductor film formed on the surface of the planarization film 96 and in the contact hole 110, the lower electrode 100 connected to the TFT 72 is formed for each pixel.

After the formation of the lower electrode 100, a bank 112 is formed at a pixel boundary. The lower electrode 100 is exposed in the effective region of the pixel surrounded by the bank 112. After the formation of the bank 112, the layers constituting the organic material layer 102 are stacked in order on the lower electrode 100. The upper electrode 104 is formed on the organic material layer 102 using a transparent electrode material.

For example, a SiNy film is deposited as the sealing layer 106 on the surface of the upper electrode 104 by a CVD method. Moreover, for ensuring the mechanical resistance of the surface of the display panel 40, the protective film 114 is stacked on the surface of the display region 42. On the other hand, the protective film 114 is not provided in the drive portion forming region 46 for facilitating connection of the IC or the FPC. The wiring lines of the FPC 50 or the terminals of the driver IC 48 are electrically connected to, for example, the wiring lines 116.

The structure of the display panel 40 in which a display functional layer including the organic light-emitting diode 6 as a display element and the circuit layer of the TFT 72 or the like is formed on one major surface of the insulating base material 70 in a film form having flexibility has been described above using FIG. 3.

Figure 4:
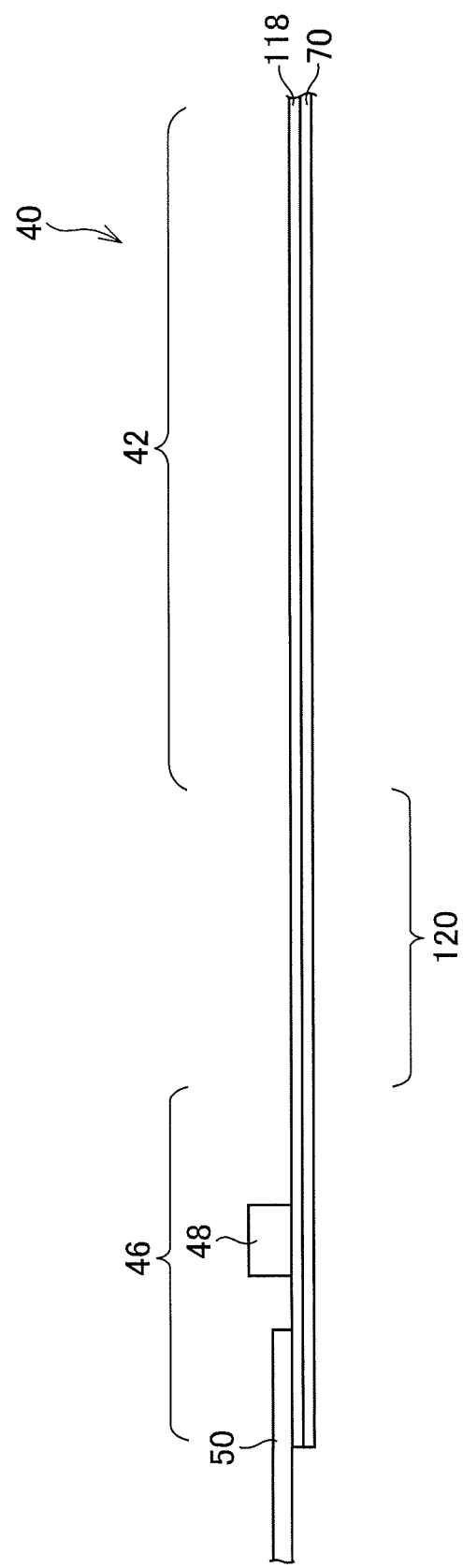
FIG. 4 is a schematic vertical sectional view of the display panel in the display device according to the embodiment.
Figure 5:
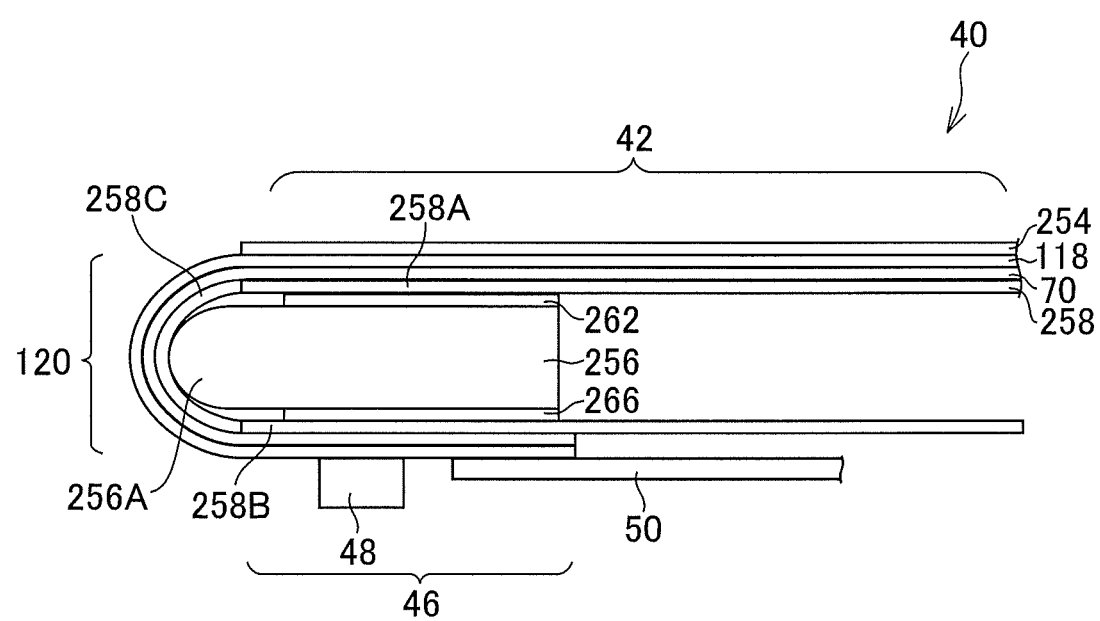
FIG. 5 is a schematic vertical sectional view of the display panel including a curved region according to the embodiment.

The display panel 40 is manufactured with the whole of the insulating base material 70 maintained flat as shown in FIG. 3. However, when the display panel 40 is accommodated in a housing of the display device 2, a curved region 120 is provided outside the display region 42 of the display panel 40, and the drive portion forming region 46 can be brought into a state of being folded back onto the rear side of the display region 42. FIG. 4 and FIG. 5 are schematic vertical sectional views of the display panel 40, corresponding to the formation of the curved region 120, and show cross sections at a position along line shown in FIG. 2. In the stacked structure of the display panel 40 shown in FIG. 3, a stacked structure of the display functional layer and the like on the insulating base material 70 is shown as an upper structure layer 118, and the structure of FIG. 3 is simplified to a two-layered structure of the insulating base material 70 and the upper structure layer 118 in FIGS. 4 and 5. FIG. 4 is a cross section in a state where the display panel 40 is maintained flat, and FIG. 5 is a cross section in a state where the curved region 120 is provided between the drive portion forming region 46 to which the FPC 50 and the driver IC 48 are attached and the display region 42, and the FPC 50 and the like are folded back onto the rear side of the display region 42.

As described above, the display region 42 includes the pixel array portion 4, and the drive portion forming region 46 includes the drive portion driving the pixel array portion 4. In addition, in the curved region 120 coupling the display region 42 with the drive portion forming region 46, the plurality of wiring lines 116 electrically connecting the pixel array portion 4 with the drive portion are disposed in the upper structure layer 118.

As shown in FIG. 5, the display panel 40 includes, in addition to the insulating base material 70 and the upper structure layer 118, a spacer 256, a front reinforcing film 254, a rear reinforcing film 258, the FPC 50, and the driver IC 48. The front reinforcing film 254 and the rear reinforcing film 258 are provided for protecting and reinforcing the insulating base material 70 and the upper structure layer 118. The spacer 256 is provided for guiding the curve of the insulating base material 70 and the upper structure layer 118.

In the display panel 40, the display region 42 where image display is performed, the curved region 120, and the drive portion forming region 46 are provided side by side in this order. The curved region 120 has a curved shape so as to be along the shape of a guide portion 256A of the spacer 256. The drive portion forming region 46 is disposed on the back surface side of the spacer 256 due to the curving of the curved region 120.

As shown in FIG. 5, the front reinforcing film 254 is provided on the display surface side of the display region 42 of the display panel 40 so as not to overlap the curved region 120.

As shown in FIG. 5, the rear reinforcing film 258 includes a first reinforcing portion 258A provided between the insulating base material 70 in the display region 42 and the spacer 256 and bonded to the insulating base material 70, a second reinforcing portion 258B provided between the insulating base material 70 in the drive portion forming region 46 and the spacer 256 and bonded to the insulating base material 70, and a curved reinforcing portion 258C provided between the insulating base material 70 in the curved region 120 and the spacer 256 and bonded to the insulating base material 70.

Moreover, as shown in FIG. 5, the second reinforcing portion 258B of the rear reinforcing film 258 is bonded to the surface of the spacer 256 on the back surface side with an adhesive member 266, and the first reinforcing portion 258A of the rear reinforcing film 258 is bonded to the surface of the spacer 256 on the display surface side with an adhesive member 262. The adhesive member 262 and the adhesive member 266 may be those made of a resin or the like having adhesion, or may be double-faced tapes or the like. In the example shown in FIG. 5, the curved reinforcing portion 258C does not adhere to the spacer 256 with an adhesive member; however, an adhesive member may be provided also at the guide portion 256A of the spacer 256. Moreover, for example, a resin having adhesion may be charged as an adhesive member into a space between the curved reinforcing portion 258C and the spacer 256, and the curved reinforcing portion 258C and the guide portion 256A of the spacer 256 may directly adhere to each other.

In the spacer 256, as shown in FIG. 5, the guide portion 256A guiding the curve of the curved region 120 of the display panel 40 has a curled shape in a sectional view. The guide portion has such a shape, and therefore, disconnection or breakage of the wiring line 116 or the like is less likely to occur in the curved region 120 of the display panel 40.

In the embodiment, a configuration in which the rear reinforcing film 258 is provided on the inner surface side of the curve of the curved region 120 is employed, and therefore, a stress occurring in the display panel 40 can be reduced, and disconnection or the like of the wiring line 116 of the display panel 40 can be prevented. Moreover, although a stress is most likely to occur in the curved region, the configuration is more likely to reduce the stress because the curved reinforcing portion 258C is provided in the curved region 120.

Figure 6:
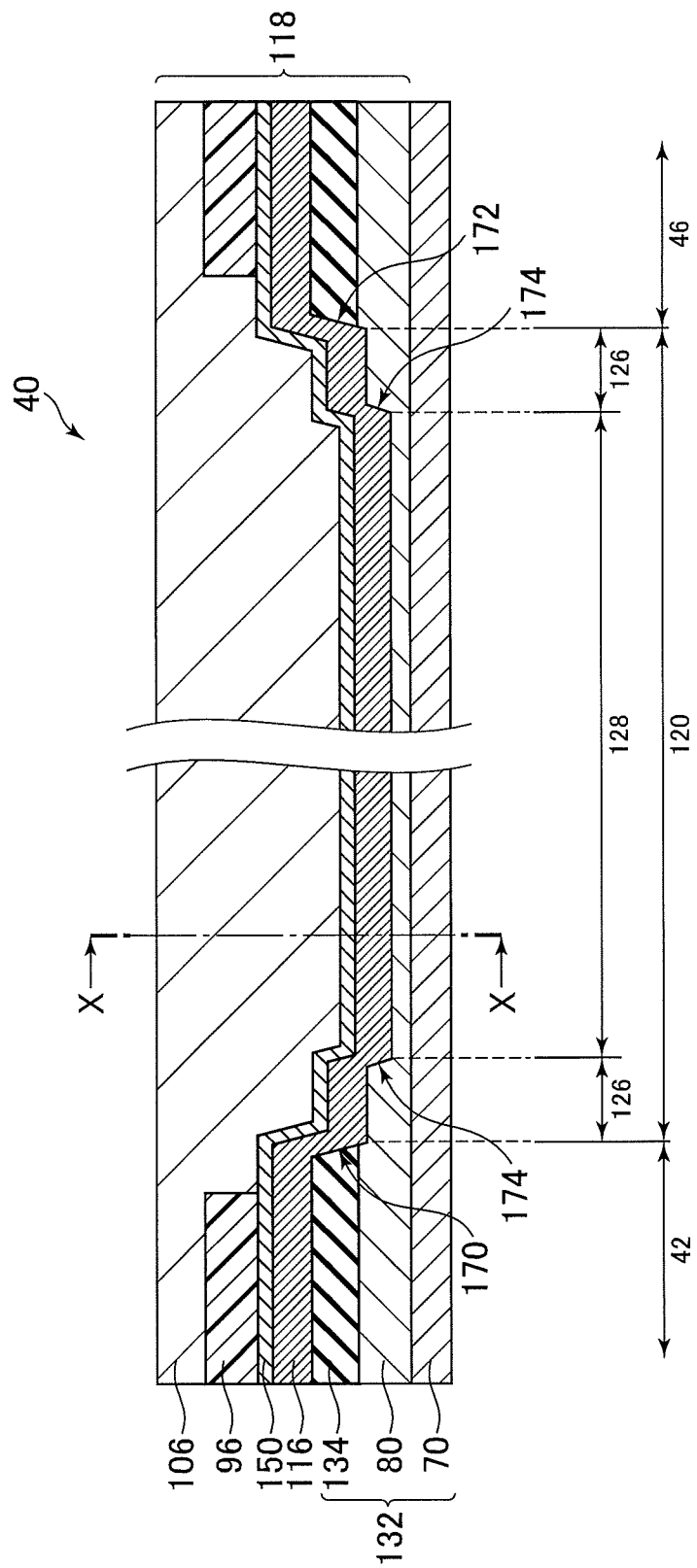
FIG. 6 is a schematic vertical sectional view in the vicinity of the curved region of the display device according to the embodiment.

FIG. 6 is a schematic vertical sectional view in the vicinity of the curved region 120 of the display device 2 according to the embodiment. As shown in FIG. 6, a first insulating film 80 formed of a stacked body of silicon nitride (SiNy) and silicon oxide (SiOx), or the like, is formed from the display region 42 over the drive portion forming region 46 on the upper surface of the insulating base material 70 made of polyimide or the like.

In the display region 42 and the drive portion forming region 46, a second insulating film 134 is formed on the upper surface of the first insulating film 80. The second insulating film 134 corresponds to, for example, the gate insulating film 84, the interlayer insulating film 88, and the like shown in FIG. 3. Similarly to the first insulating film 80, the second insulating film 134 can be formed using silicon nitride (SiNy), silicon oxide (SiOx), or the like. The insulating base material 70, the first insulating film 80, and the second insulating film 134 constitute an insulating sheet 132. The first insulating film 80 and the second insulating film 134 are inorganic insulating films, and the insulating base material 70 is an organic insulating film.

Figure 7:
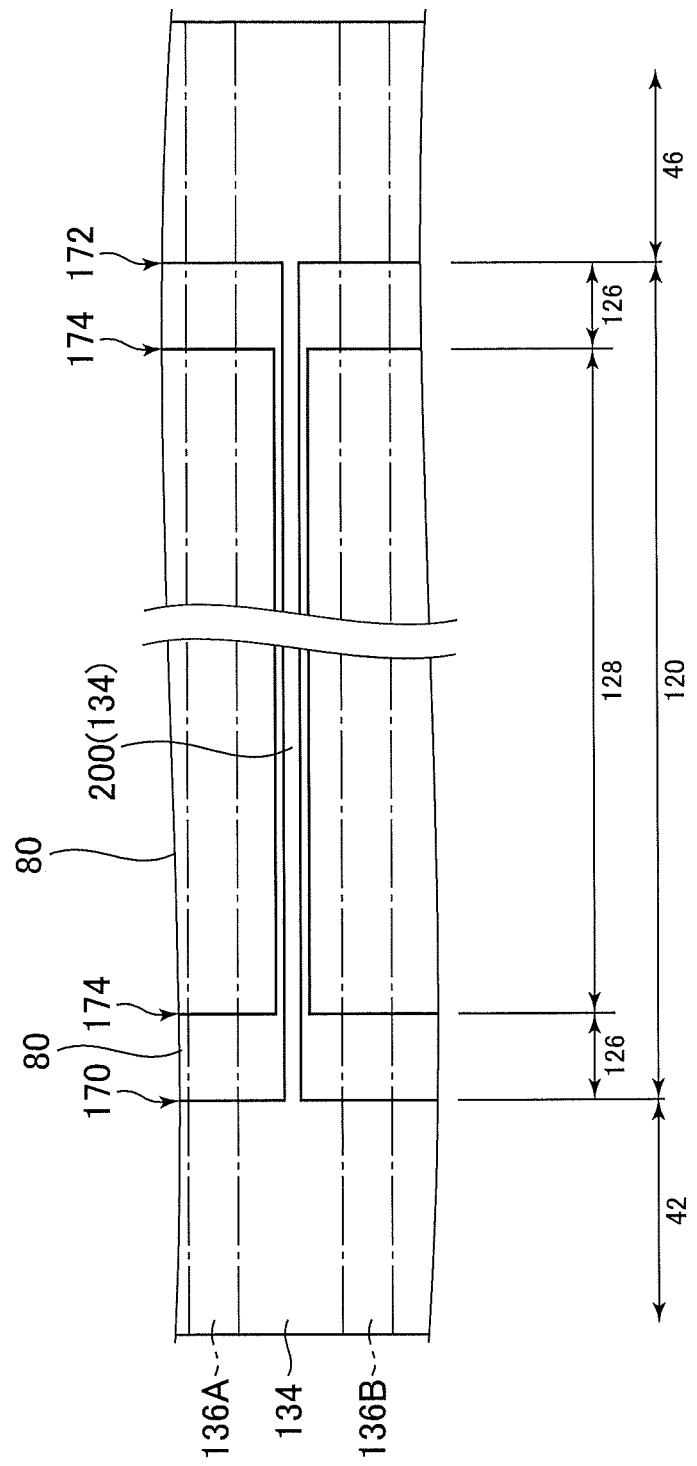
FIG. 7 is a schematic plan view showing a manufacturing process of the display device according to the embodiment.

FIG. 7 is a top view showing a state after the second insulating film 134 is formed. As shown in FIG. 7, the second insulating film 134 is not provided in most region of the curved region 120, and is provided only between two wiring line forming regions 136A and 136B where the wiring line 116 is formed. The second insulating film 134 provided between the two wiring line forming regions 136A and 136B serves as an insulating wall 200. By employing a configuration in which the second insulating film 134 is not provided in most region of the curved region 120 except for the forming region of the insulating wall 200 as described above, the rigidity of the insulating sheet 132, shown in FIG. 6, in the curved region 120 can be lowered. Due to the lowering of the rigidity, the risk of cracking of the inorganic insulating film caused by its bending in the curved region 120 is reduced. An organic film or a metal film does not have a high risk of cracking caused by bending. In a region where the second insulating film 134 is not provided, the film thickness of the insulating sheet 132 is a first film thickness thinner than the film thickness at the display region 42 and the film thickness at the drive portion forming region 46, and this region is defined as a first film-thickness region 126. A first step portion 170 is formed between the first film-thickness region 126 and the display region 42, and a second step portion 172 is formed between the first film-thickness region 126 and the drive portion forming region 46. The insulating wall 200 extends from the first step portion 170 to the second step portion 172.

In the embodiment, a configuration is employed in which the upper surface of the second insulating film 134 and the upper surface of the insulating wall 200 are continuous with each other. That is, the upper surface of the insulating wall 200 is continuous with the upper surface of the insulating sheet 132 in the display region 42 and the drive portion forming region 46. This is because the insulating wall 200 and the second insulating film 134 are simultaneously formed using the same material in a step for forming the second insulating film 134.

Further, as shown in FIGS. 6 and 7, the insulating sheet 132 includes, on the center side of the first film-thickness region 126, a second film-thickness region 128 having a second film thickness thinner than the first film thickness. The curved region 120 includes the second film-thickness region 128 having a thinner film thickness, so that further lowering of the rigidity of the insulating sheet 132 can be realized. A third step portion 174 is formed at a boundary portion between the first film-thickness region 126 and the second film-thickness region 128.

As shown in FIG. 6, the wiring line 116 is provided on the upper surface of the second insulating film 134 and the upper surface of the first insulating film 80 in the curved region 120. For the wiring line 116, a wiring layer is formed on the entire surface of the insulating sheet 132 by, for example, sputtering or the like, and then processed into the shape of the wiring line 116 by performing dry etching.

Figure 8:
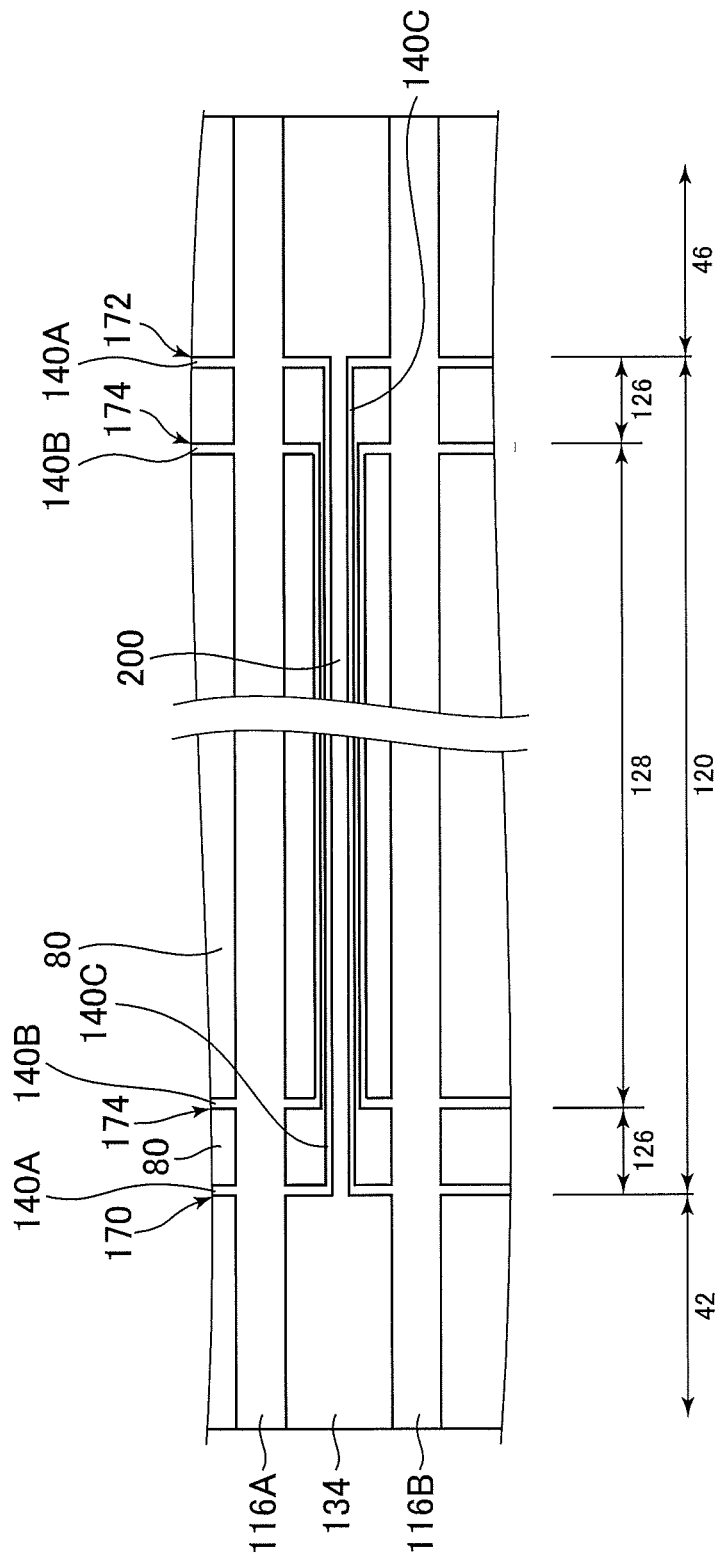
FIG. 8 is a schematic plan view showing the manufacturing process of the display device according to the embodiment.

FIG. 8 is a top view showing a state where, after the wiring layer is formed, a first wiring line 116A and a second wiring line 116B are formed by dry etching. The first wiring line 116A and the second 116B run in parallel with each other, and electrically connect the pixel array portion 4 provided in the display region 42 with the driver IC 48 and the like constituting the drive portion provided in the drive portion forming region 46. Both the first wiring line 116A and the second wiring line 116B cross the first step portion 170 and the second step portion 172. Moreover, in the embodiment, both the first wiring line 116A and the second wiring line 116B cross the third step portion 174.

Originally, it is desirable to form the first wiring line 116A and the second wiring line 116B only at planned portions in the wiring line forming regions 136A and 136B described above using FIG. 7. Actually, however, there is a possibility that a first conductor 140A that cannot be removed in the dry etching step remains at the first step portion 170 and the second step portion 172 as shown in FIG. 8.

Further, as described above, there is a possibility that a second conductor 140B that cannot be removed in the dry etching step remains also at the third step portion 174.

However, in the embodiment, the display panel 40 includes the insulating wall 200 formed before forming a conductor 140 as shown in FIG. 8, and therefore, it is possible to prevent the first conductor 140A and the second conductor 140B, which cannot be removed in the dry etching step, from electrically connecting the first wiring line 116A with the second wiring line 116B.

In the case of providing the insulating wall 200, there is a possibility that a third conductor 140C that cannot be removed in the dry etching step remains also at a step portion at a boundary between the forming portion of the insulating wall 200 and the non-forming portion of the insulating wall 200. However, the insulating wall 200 is configured to extend from the first step portion 170 to the second step portion 172 between the first wiring line 116A and the second wiring line 116B, and therefore, it is possible to prevent the first conductor 140A remaining on one side of the insulating wall 200 and the first conductor 140A remaining on the other side of the insulating wall 200 from being electrically connected by the third conductor 140C. As a result, it is possible to prevent the first wiring line 116A and the second wiring line 116B from being electrically connected.

Figure 9:
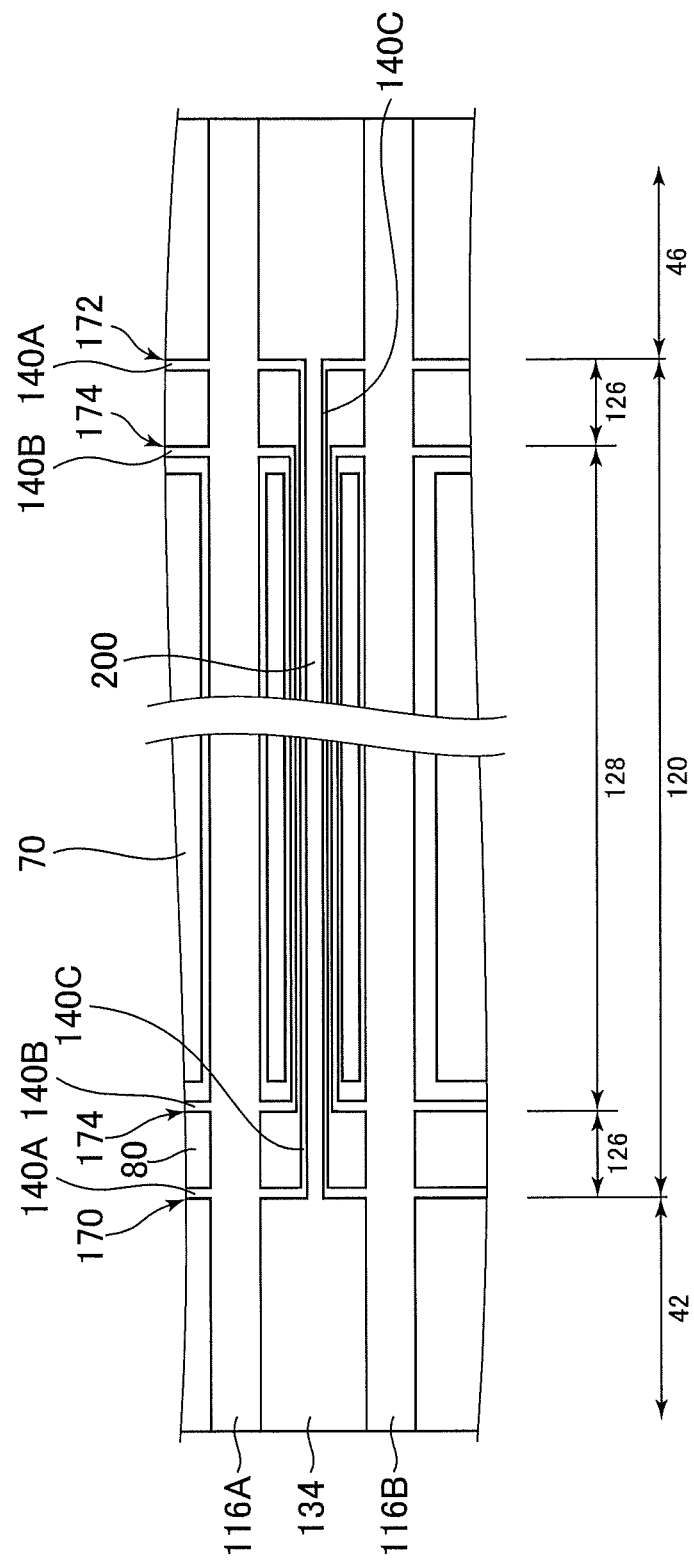
FIG. 9 is a schematic plan view showing the manufacturing process of the display device according to the embodiment.

A configuration may be employed in which, after the first wiring line 116A and the second wiring line 116B are formed, etching is performed on a region of the first insulating film 80 where the first wiring line 116A and the second wiring line 116B are not formed in the second film-thickness region 128 to expose the upper surface of the insulating base material 70 from a portion or the entire surface of the first insulating film 80 as shown in FIG. 9. By employing such a configuration, it is possible to realize further lowering of the rigidity of the insulating sheet 132.

Figure 10:
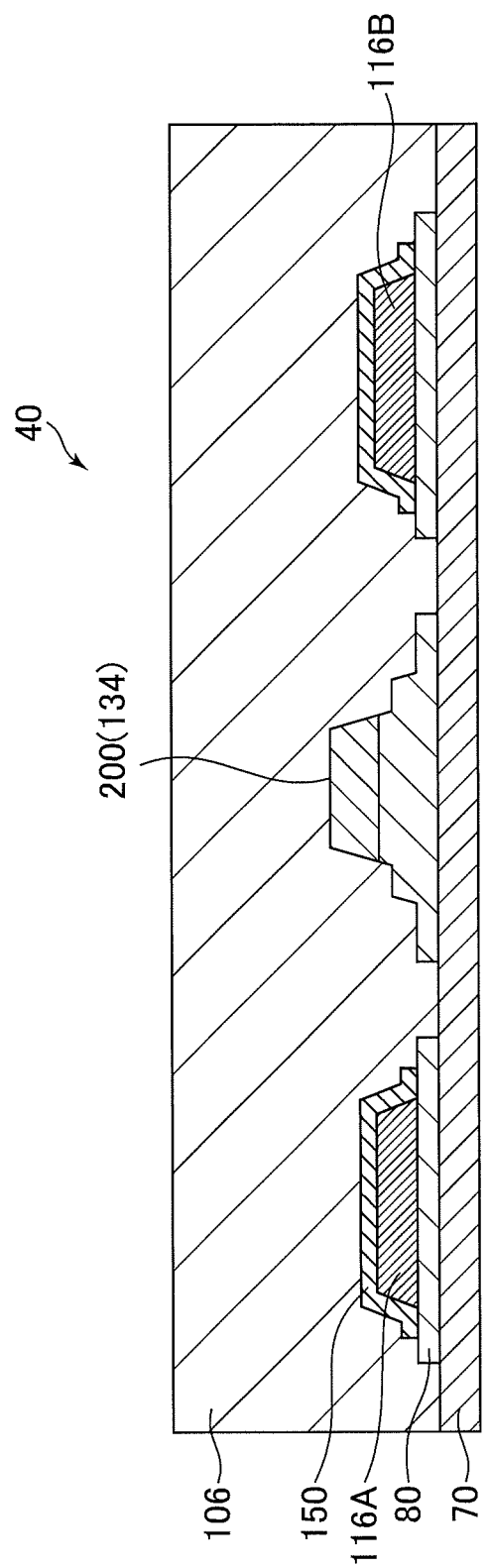
FIG. 10 is a schematic vertical sectional view of the display panel at a position along line X-X shown in FIG. 6.

Thereafter, as shown in FIG. 6 and FIG. 10 showing a cross section along line X-X in FIG. 6, an inorganic insulating film 150 covering the upper and side surfaces of the first wiring line 116A and the second wiring line 116B is formed. The inorganic insulating film 150 is formed using, for example, silicon nitride or the like.

Then, as shown in FIG. 6, the planarization film 96 is formed on the inorganic insulating film 150 in the display region 42 and the drive portion forming region 46, and on the upper surface and the like where the first insulating film 80 and the second insulating film 134 are exposed. The planarization film 96 is formed using, for example, polyimide or the like.

Finally, as shown in FIG. 6 and FIG. 10, the sealing layer 106 sealing the entire upper surface of the display panel 40 is formed. The sealing layer 106 is formed using, for example, a silicon nitride film or the like as described above.

Figure 11:
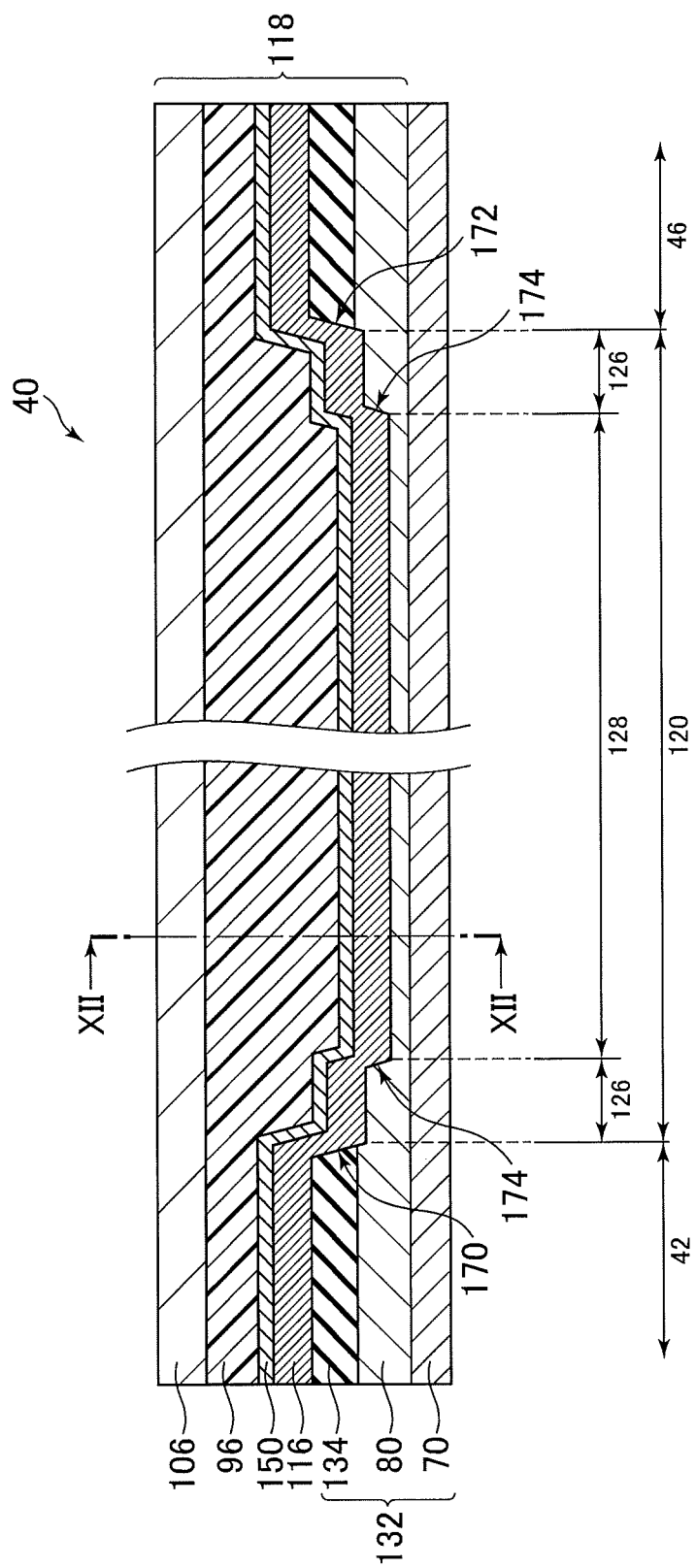
FIG. 11 is a schematic vertical sectional view in the vicinity of the curved region of the display device according to the embodiment.
Figure 12:
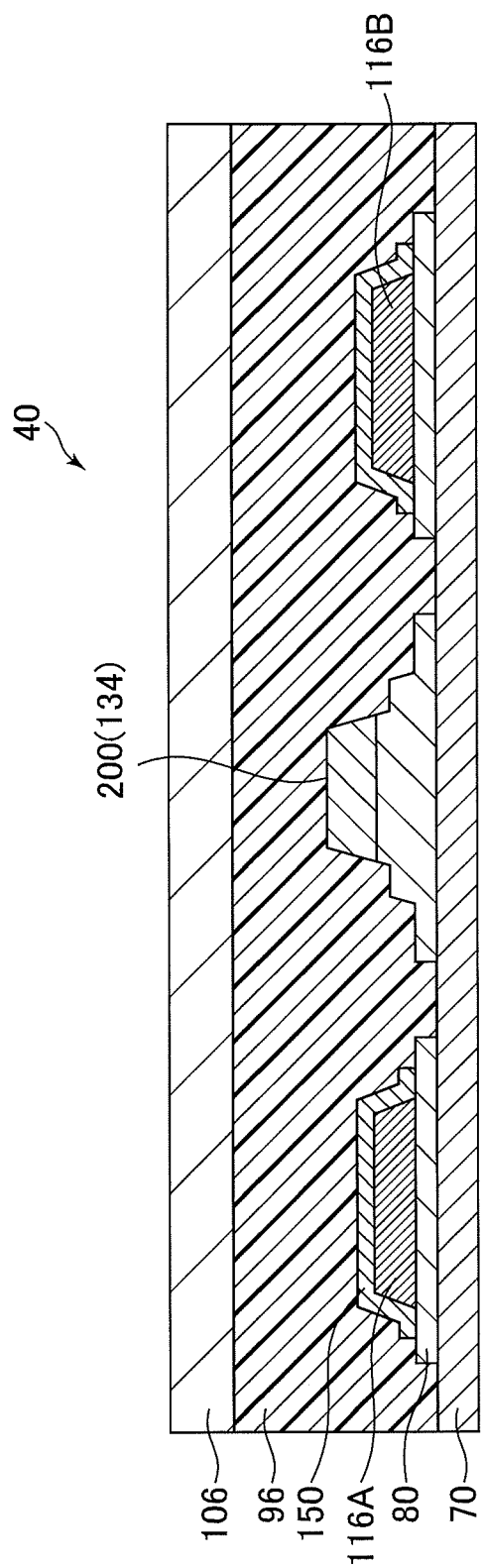
FIG. 12 is a schematic vertical sectional view of the display panel at a position along line XII-XII shown in FIG. 11.

In the above description, an example in which the planarization film 96 is formed only in the display region 42 and the drive portion forming region 46 has been described; however, as shown in FIGS. 11 and 12, it does not matter that the display panel 40 is configured to include the planarization film 96 in all regions of the display region 42, the curved region 120, and the drive portion forming region 46.

Figure 13:
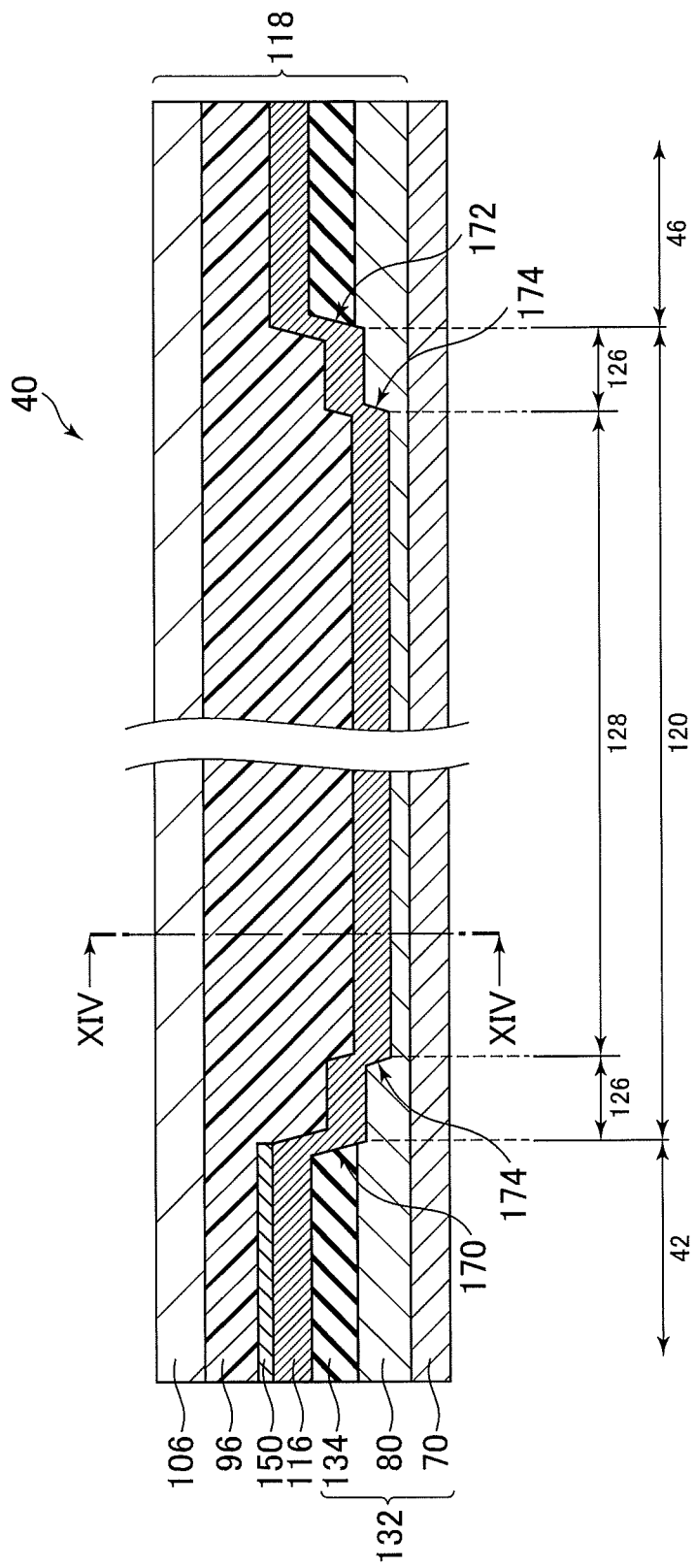
FIG. 13 is a schematic vertical sectional view in the vicinity of the curved region of the display device according to the embodiment.
Figure 14:
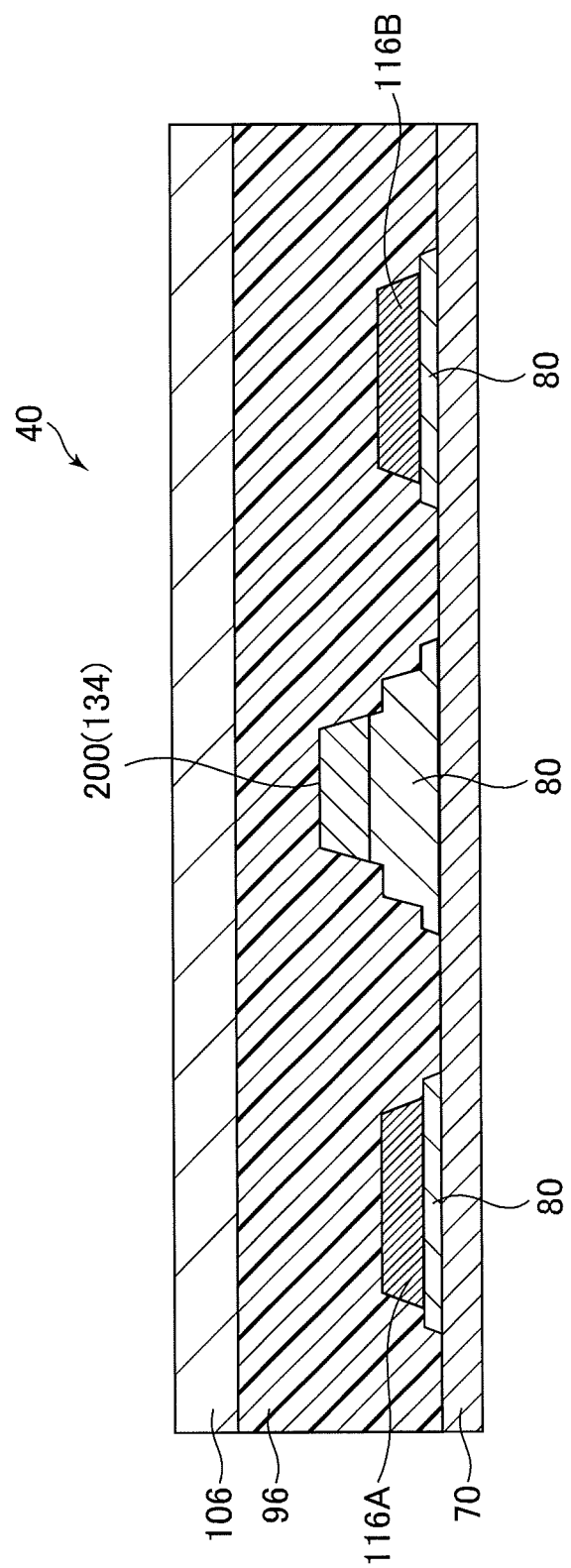
FIG. 14 is a schematic vertical sectional view of the display panel at a position along line XIV-XIV shown in FIG. 13.

Moreover, in the above description, an example in which the inorganic insulating film 150 is provided in all of the display region 42, the curved region 120, and the drive portion forming region 46 has been described; however, as shown in FIGS. 13 and 14, it does not matter that a configuration is employed in which the inorganic insulating film 150 is formed only in the display region 42, and the inorganic insulating film 150 is not provided in the curved region 120 and the drive portion forming region 46. The planarization film 96, the sealing layer 106, and the like cover the upper and side surfaces of the plurality of wiring lines 116, and therefore, the planarization film 96 and the sealing layer 106 can secure insulation between the plurality of wiring lines 116 even when the inorganic insulating film 150 is not provided. In an example shown in FIGS. 13 and 14, a configuration is employed in which the upper surface of the insulating base material 70 is exposed from the entire surface of the first insulating film 80 in the second film-thickness region 128, and the wiring line 116 is provided on the upper surface of the insulating base material 70 in the second film-thickness region 128. That is, the film thickness of the insulating sheet 132 in the second film-thickness region 128 is the thickness of only the insulating base material 70. By employing such a configuration, a further reduction in rigidity in the curved region 120 can be achieved.

Figure 15:
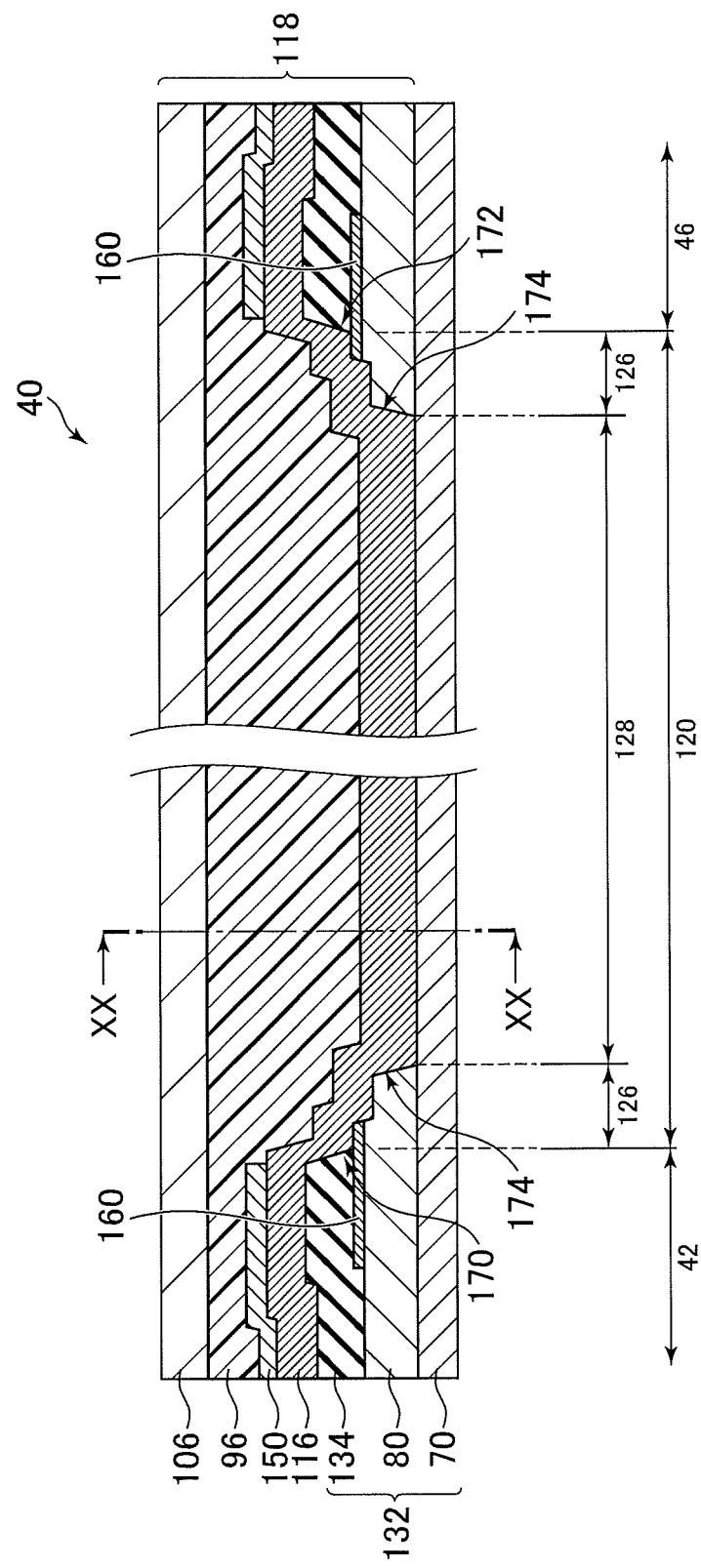
FIG. 15 is a schematic vertical sectional view in the vicinity of the curved region of the display device according to the embodiment.
Figure 16:
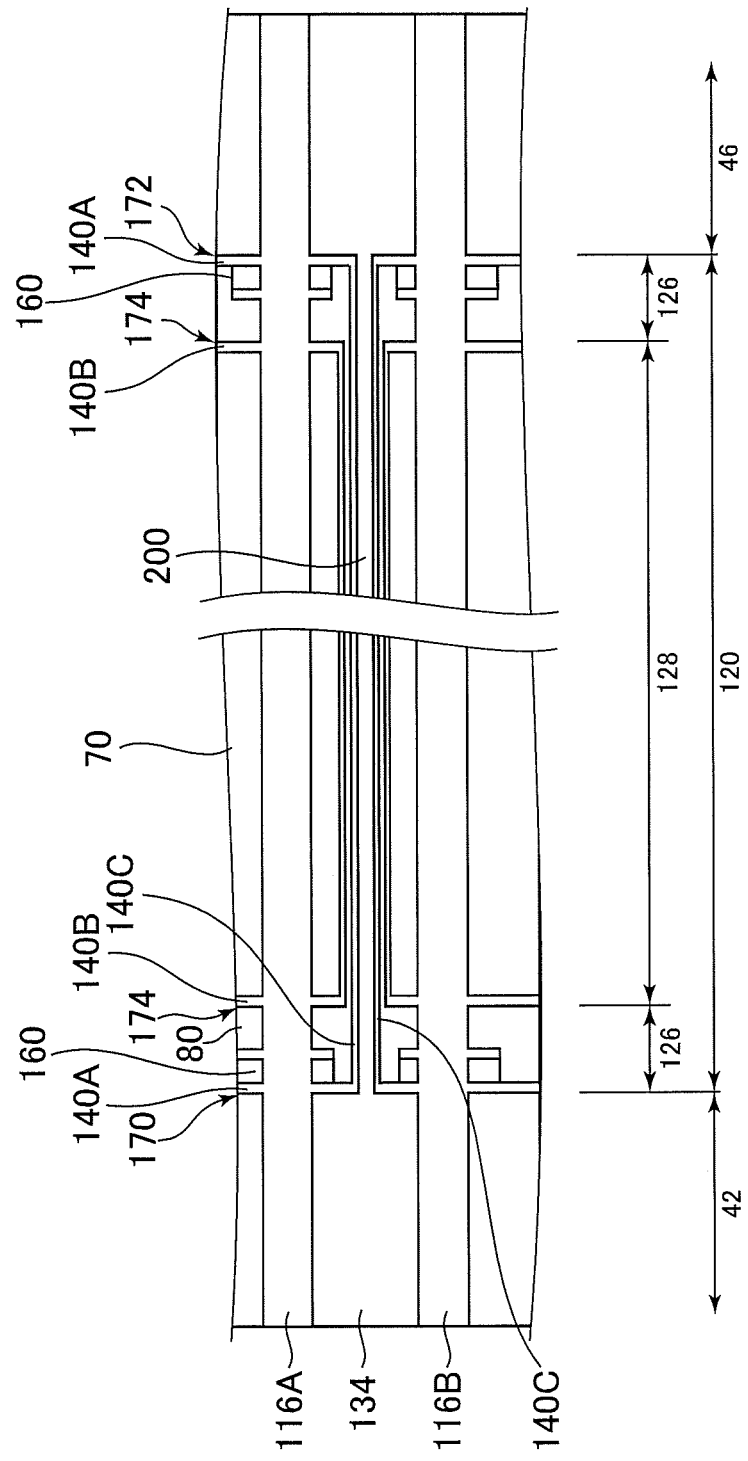
FIG. 16 is a schematic plan view showing the manufacturing process of the display device according to the embodiment.

As shown in FIGS. 15 and 16 and FIG. 20 showing a cross section along line XX-XX in FIG. 15, it is desirable to employ a configuration in which a step reducing layer 160 is provided between the second insulating film 134 and the first insulating film 80. The step reducing layer 160 is formed on the upper surface of the first insulating film 80, and is formed such that a portion of the step reducing layer 160 protrudes from the lower surface of the second insulating film 134. Due to the presence of the step reducing layer 160, the wiring line 116 formed on the upper surfaces of the second insulating film 134 and the first insulating film 80 can be prevented from having a steep inclination at a boundary region between the second insulating film 134 and the first insulating film 80, and as a result, the occurrence of disconnection of the wiring line 116 can be prevented. The step reducing layer 160 can be formed using, for example, a polysilicon film or the like.

Here, as shown in FIG. 20, by employing a configuration in which the first insulating film 80 is not provided below the wiring line 116 in the curved region 120, the risk of breakage of the wiring line 116 can be reduced. That is, an inorganic insulating film generally has a high risk of cracking caused by bending. Therefore, there is a risk that the first insulating film 80 as an inorganic insulating film cracks in curving the curved region 120. However, according to the example shown in FIGS. 15, 16, and 20, the configuration is employed in which the first insulating film 80 is not provided below the wiring line 116 in the curved region 120, and therefore, the cracking of the first insulating film 80 caused by bending of the curved region 120 can be prevented. As a result, the risk of breakage of the wiring line 116 by an impact caused by the cracking of the first insulating film 80 can be reduced.

In the embodiment, a configuration in which the insulating wall 200 is formed integrally with the second insulating film 134 has been described by way of example; however, the insulating wall 200 and the second insulating film 134 may be configured as separate bodies. However, a reduction in manufacturing cost can be achieved by integrally forming the insulating wall 200 and the second insulating film 134 using the same material as shown in the embodiment.

Moreover, by integrally forming the insulating wall 200 and the second insulating film 134 using the same material, the possibility that the first wiring line 116A and the second wiring line 116B are electrically connected can be further reduced. That is, the risk that the first wiring line 116A and the second wiring line 116B are electrically connected is highest at the boundary region between the first insulating film 80 and the second insulating film 134 where the first conductor 140A may remain due to the influence of a step generated up to the vicinity of the insulating wall 200. However, this boundary region between the first insulating film 80 and the second insulating film 134 is also a boundary region between the second insulating film 134 and the insulating wall 200. Therefore, by integrally forming previously the second insulating film 134 and the insulating wall 200 using the same material, the possibility that the second insulating film 134 and the insulating wall 200 rupture by a stress applied at the time of forming the curved region 120 can be reduced, and as a result, the possibility that the first wiring line 116A and the second wiring line 116B are electrically connected can be further reduced.

Figure 17:
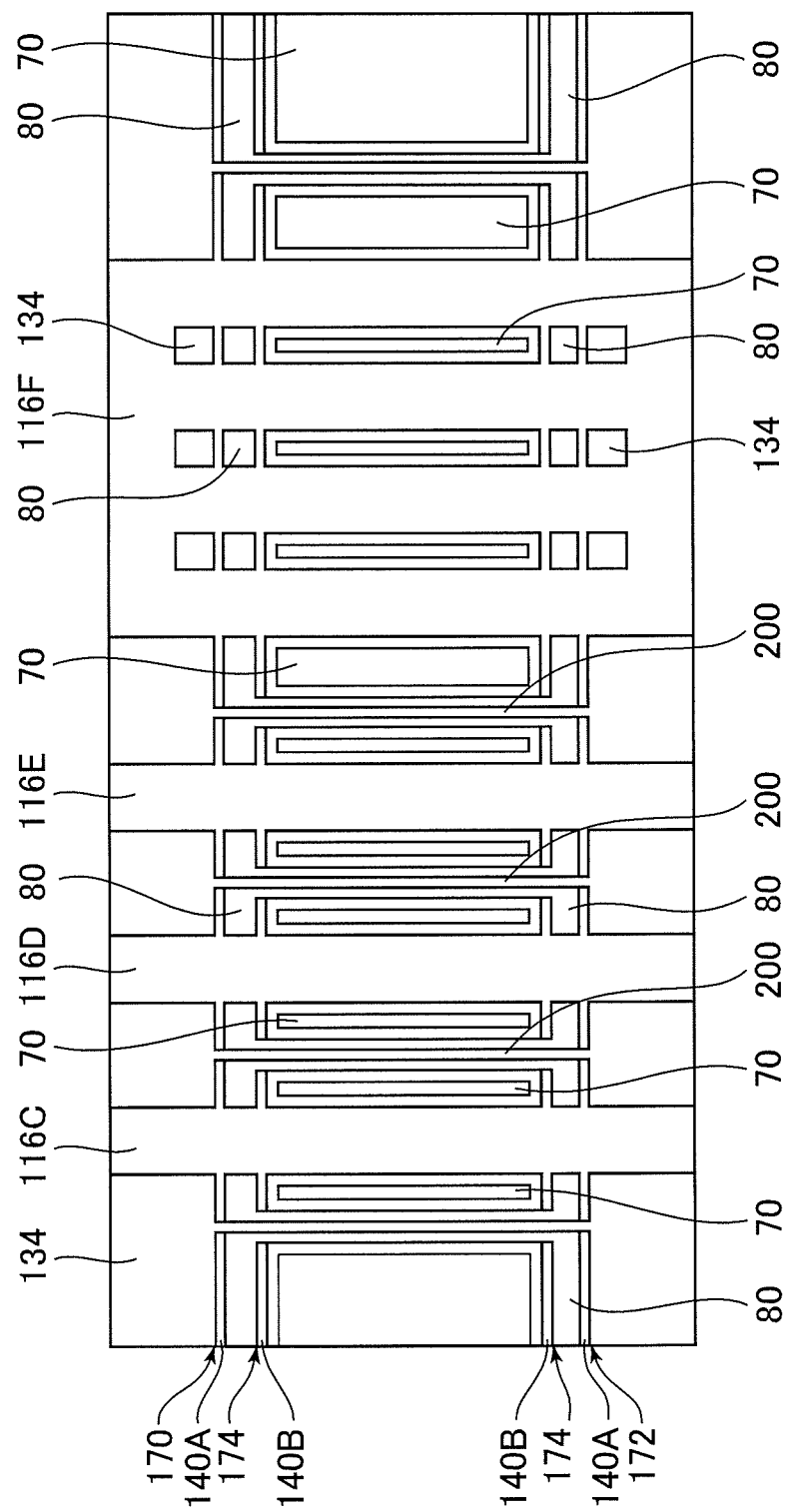
FIG. 17 is a schematic plan view showing the manufacturing process of the display device according to the embodiment.
Figure 18:
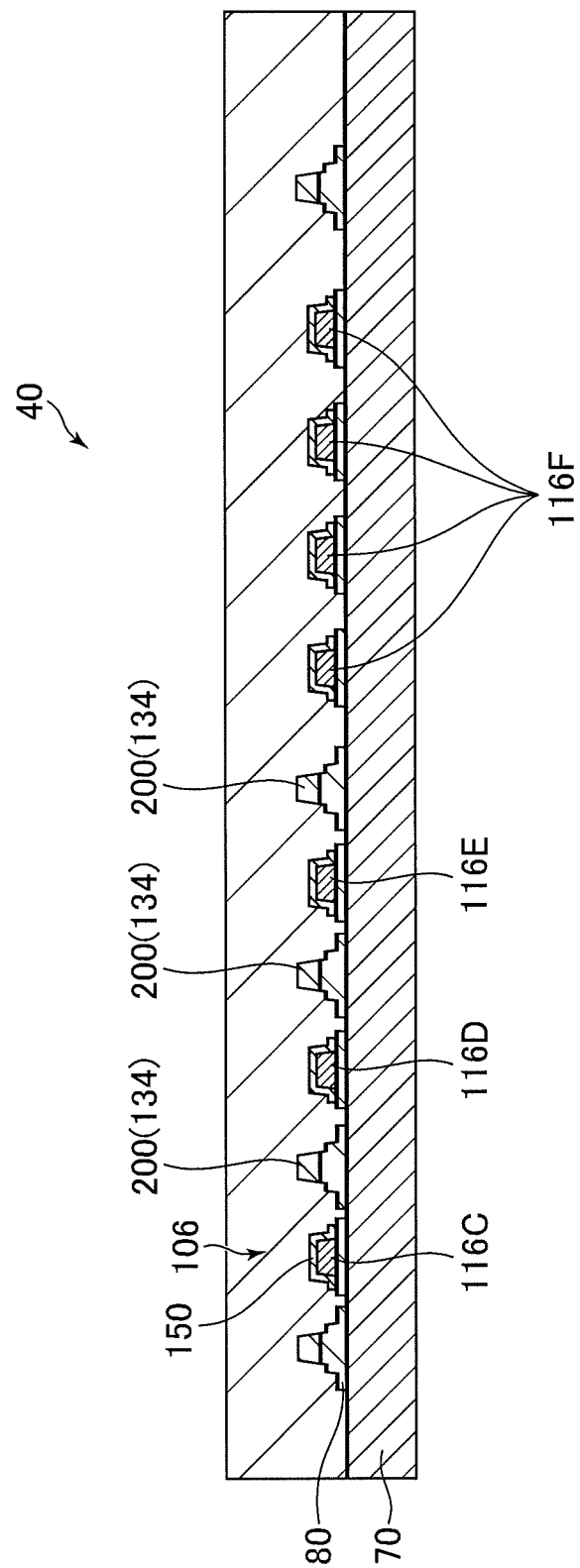
FIG. 18 is a schematic vertical sectional view in the curved region of the display device according to the embodiment.

As shown in FIGS. 17 and 18, by providing the insulating wall 200 described above between a plurality of signal lines 116C, 116D, and 116E at different potentials, the signal line 116C and the signal line 116D, and the signal line 116D and the signal line 116E, can be prevented from being electrically connected by the first conductor 140A and the second conductor 140B, which cannot be removed in the dry etching step, and thus this is desirable. Similarly, by providing the insulating wall 200 described above also between the signal line 116E and a power supply line 116F at different potentials, the signal line 116E and the power supply line 116F can be prevented from being electrically connected by the first conductor 140A and the second conductor 140B, and thus this is desirable.

When an opening is provided in the power supply line 116F so as to reduce the rigidity of the curved region 120 as shown in FIGS. 17 and 18, it is not necessary to provide the insulating wall 200 in the opening forming region. This is because the potential of the power supply line 116F does not change between the right and left sides of the opening, and there is no problem even when the right and left sides of the opening are electrically connected by the first conductor 140A and the second conductor 140B, which cannot be removed in the dry etching step. Moreover, by employing a configuration in which the insulating wall 200 is not provided in the opening forming region, the power supply line 116F can be formed in a limited area, and the reduced area of the display device 2 can be achieved.

Figure 19:
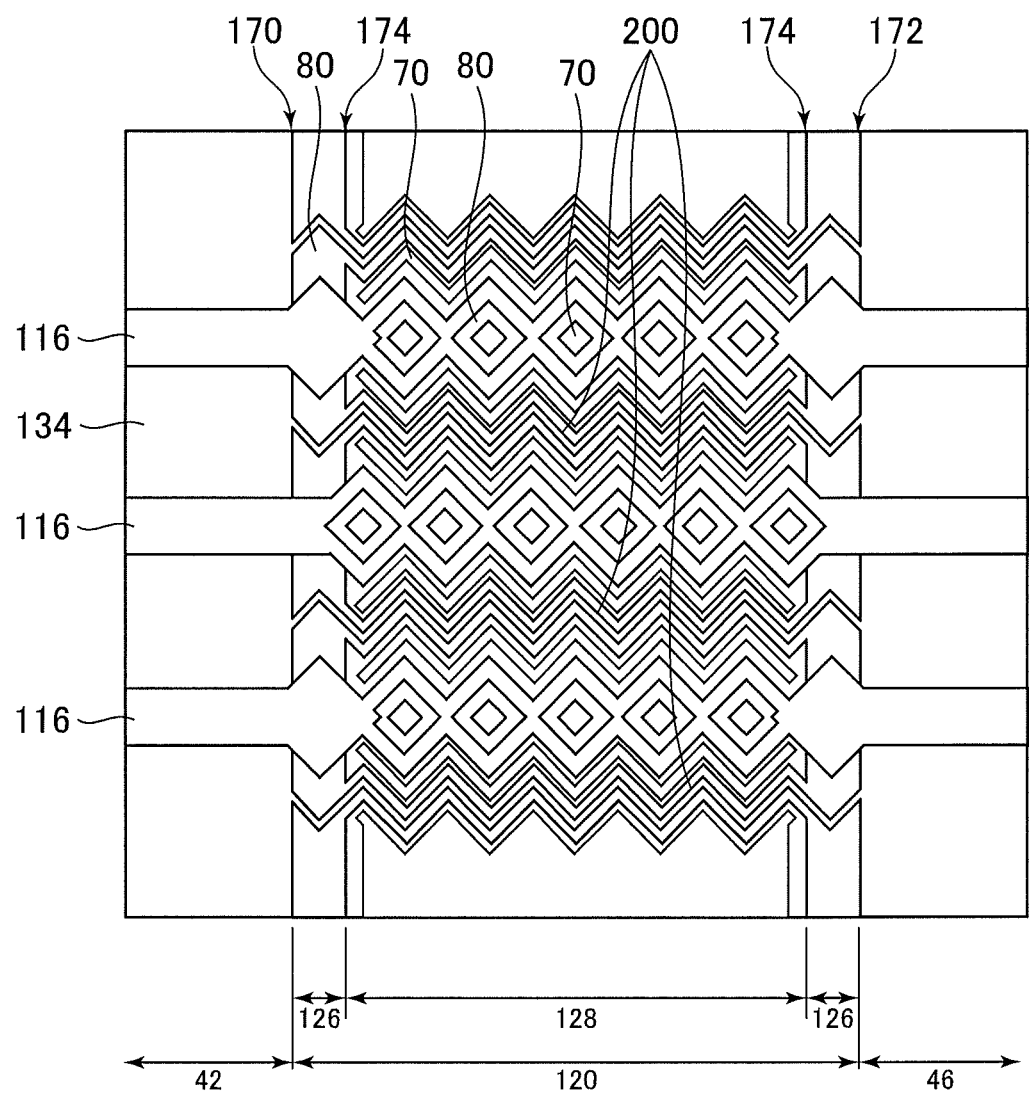
FIG. 19 is a schematic plan view showing the manufacturing process of the display device according to the embodiment.

Moreover, when each of the wiring lines 116 has a shape in which a plurality of rhombuses are combined as shown in FIG. 19, it is desirable that the shape of the insulating wall 200 provided between the wiring lines 116 is a zigzag shape including a curved portion conforming to the vertices of the rhombuses. By employing such a configuration, it is possible to more closely dispose each of the wiring lines 116 and the insulating wall 200. Further, the bending resistance of each of the wiring lines 116 itself is also increased.

When the conductor is removed by etching or the like inside the rhombus shape in each of the wiring lines 116 to provide an opening to expose the first insulating film 80 and the insulating base material 70 as shown in FIG. 19, it is not necessary to provide the insulating wall 200. This is because the potential does not change in the same wiring line 116, and there is no problem even when the wiring line 116 is electrically connected by the conductor 140 that cannot be removed in the dry etching step. On the contrary, by employing a configuration in which the insulating wall 200 is not provided in the opening region, the freedom of the shape of the wiring line 116 can be increased. Moreover, the insulating wall 200 can be prevented from becoming dust and scattering in the opening region having a small area, and as a result, a trouble serving as a harmful effect on a yield or the like can be avoided, which is desirable.

Various altered and modified examples within the range of the idea of the invention will occur to those skilled in the art, and it is understood that the altered and modified examples also belong to the scope of the invention. For example, when those skilled in the art appropriately add or remove a component or change the design of a component in each embodiment described above, or add or omit a step or change the conditions of a step therein, those are included in the scope of the invention as long as they include the spirit of the invention.

What is claimed is:

1. A display device comprising a display panel including a display region including a pixel array portion, a drive portion forming region provided on a rear surface side of the display region and including a drive portion driving the pixel array portion, and a curved region coupling the display region with the drive portion forming region, wherein
    the display panel includes
        an insulating sheet provided from the display region to the drive portion forming region, including, in the curved region, a first film-thickness region having a first film thickness thinner than a film thickness at the display region and a film thickness at the drive portion forming region, and including a first step portion disposed between the display region and the first film-thickness region and a second step portion disposed between the drive portion forming region and the first film-thickness region,
        first and second wiring lines crossing the first step portion and the second step portion on an outer side of the insulating sheet in the curved region and electrically connecting the pixel array portion with the drive portion, and
        an insulating wall extending on the outer side of the insulating sheet in the curved region from the first step portion to the second step portion between the first wiring line and the second wiring line, and
    the insulating sheet includes an insulating base material provided in the display region, the drive portion forming region, and the curved region, and a plurality of insulating films provided on the outside of the curve of the insulating base material.

2. The display device according to claim 1, wherein
    an upper surface of the insulating wall is continuous with an upper surface of the insulating sheet in the display region and the drive portion forming region.

3. The display device according to claim 1, comprising a first conductor disposed at the first step portion and the second step portion.

4. The display device according to claim 1, wherein
    the insulating sheet includes, on a center side of the first film-thickness region, a second film-thickness region having a second film thickness thinner than the first film thickness, and
    at least one of the first wiring line and the second wiring line is disposed so as to cross a third step portion disposed between the first film-thickness region and the second film-thickness region.

5. The display device according to claim 4, comprising a second conductor disposed at the third step portion.

6. The display device according to claim 4, wherein
    the plurality of insulating films include a first insulating film, and an upper surface of the insulating base material is exposed from at least a portion of the first insulating film in the second film-thickness region.

7. The display device according to claim 6, wherein
    the insulating base material is made of polyimide.

8. The display device according to claim 6, wherein
    the first insulating film is formed of a stacked body of a silicon oxide layer and a silicon nitride layer.

9. The display device according to claim 6, wherein
    the insulating sheet further includes a second insulating film between the first insulating film in the display region and the first wiring line and between the first insulating film and the second wiring line.

10. The display device according to claim 9, wherein
    at least a portion of the insulating wall is made of the same material as the second insulating film.

11. The display device according to claim 1, wherein
    the first wiring line and the second wiring line are signal lines at different potentials.

12. A display device comprising a display panel including a display region including a pixel array portion, a drive portion forming region provided on a rear surface side of the display region and including a drive portion driving the pixel array portion, and a curved region coupling the display region with the drive portion forming region, wherein
    the display panel includes
        an insulating base material made of an organic material,
        an inorganic insulating film provided on the insulating base material, made of an inorganic insulating material, provided from the display region to the drive portion forming region, including, in the curved region, a first film-thickness region having a first film thickness thinner than a film thickness at the display region and a film thickness at the drive portion forming region, and including a first step portion disposed between the display region and the first film-thickness region and a second step portion disposed between the drive portion forming region and the first film-thickness region, first and second wiring lines crossing the first step portion and the second step portion on an outer side of the inorganic insulating film in the curved region and electrically connecting the pixel array portion with the drive portion, and an insulating wall extending on the outside of the inorganic insulating film in the curved region from the first step portion to the second step portion between the first wiring line and the second wiring line.

13. The display device according to claim 12, wherein an upper surface of the insulating wall is continuous with an upper surface of the inorganic insulating film in the display region and the drive portion forming region.

14. The display device according to claim 12, comprising a first conductor disposed at the first step portion and the second step portion.

15. The display device according to claim 12, wherein
the inorganic insulating film includes, on a center side of the first film-thickness region, a second film-thickness region having a second film thickness thinner than the first film thickness, and
at least one of the first wiring line and the second wiring line is disposed so as to cross a third step portion disposed between the first film-thickness region and the second film-thickness region.

16. The display device according to claim 12, wherein
the inorganic insulating film includes a first insulating film disposed between the insulating base material and the first and second wiring lines, and a second insulating film disposed between the first insulating film and the first and second wiring lines.

17. The display device according to claim 16, wherein
at least a portion of the insulating wall is made of the same material as the second insulating film.

* * * * *